US012167543B2

(12) United States Patent
Bin Ismail et al.

(10) Patent No.: US 12,167,543 B2
(45) Date of Patent: Dec. 10, 2024

(54) SOLDER MASK ARRANGEMENT FOR A COMPONENT CARRIER

(71) Applicant: AT&S (Chongqing) Company Limited, Chongqing (CN)

(72) Inventors: Ismadi Bin Ismail, Kuching (MY); Fanyi Chiu, New Taipei (TW)

(73) Assignee: AT&S(Chongqing) Company Limited, Chongqing (CN)

( * ) Notice: Subject to any disclaimer, the term of this patent is extended or adjusted under 35 U.S.C. 154(b) by 589 days.

(21) Appl. No.: 17/447,518

(22) Filed: Sep. 13, 2021

(65) Prior Publication Data
US 2022/0210924 A1 Jun. 30, 2022

(30) Foreign Application Priority Data
Dec. 30, 2020 (CN) .......................... 202023288733.X

(51) Int. Cl.
B32B 27/02 (2006.01)
B23K 1/00 (2006.01)
B23K 3/08 (2006.01)
H05K 1/02 (2006.01)
H05K 3/34 (2006.01)
B23K 101/42 (2006.01)

(52) U.S. Cl.
CPC ......... H05K 3/3452 (2013.01); B23K 1/0016 (2013.01); B23K 3/08 (2013.01); H05K 1/024 (2013.01); B23K 2101/42 (2018.08)

(58) Field of Classification Search
CPC .... B23K 1/0016; B23K 2101/42; B23K 3/08; H05K 1/024; H05K 3/287; H05K 3/3452
See application file for complete search history.

(56) References Cited

U.S. PATENT DOCUMENTS

| 6,268,645 B1 | 7/2001 | Takenaka et al. |
| 2004/0149681 A1* | 8/2004 | Maa ................ H01L 23/49816 216/13 |

FOREIGN PATENT DOCUMENTS

| CN | 103096633 A | 5/2013 |
| CN | 111065212 A | 4/2020 |
| CN | 111586989 A | 8/2020 |
| CN | 111970850 A | 11/2020 |
| JP | H05160557 A | 6/1993 |

* cited by examiner

Primary Examiner — Lawrence D Ferguson
(74) Attorney, Agent, or Firm — Robert A. Blaha; Smith Tempel Blaha LLC

(57) ABSTRACT

A component carrier system with a component carrier, a base solder mask layer formed on a surface of the component carrier, and a top solder mask layer formed on top of a predefined section of the base solder mask. The predefined section of the base solder mask covers a target section of the component carrier.

13 Claims, 5 Drawing Sheets

SOLDER MASK ARRANGEMENT FOR A COMPONENT CARRIER

CROSS-REFERENCE TO RELATED APPLICATION

This application claims the benefit of the filing date of Chinese Utility Model Application No. 202023288733.X filed Dec. 30, 2020, the disclosure of which is incorporated herein by reference in its entirety.

Technical Field

Embodiments of the invention relate to a component carrier system.

Technological Background

In the context of growing product functionalities of component carriers equipped with one or more components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions. More and more functions are integrated in a component carrier.

In order to protect conductive paths or pads on a component carrier (PCB), solder masks for protection against oxidation and e.g., to prevent solder bridges from forming between closely spaced solder pads have been applied. Once applied, openings must be made in the solder mask wherever components are soldered, which is accomplished using photolithography.

Furthermore, some special requirement such as identification marking may call for a thicker solder resist. However, in general, the thicker dry film solder mask raw material is difficult to manufacture. In addition, starting with a dry film solder mask raw material above a particular thickness may cause one or more processing issues such as a requirement for increased lamination temperature or time, exposure energy and/or development time. Such processing requirements can lead to more defects such as poor development, dry film surface cracks, etc. In addition, in a single step manufacturing process, only one general thickness of the solder mask, in particular by a dry film solder mask, is possible. Thus, it is difficult to manufacture and hence to provide a respective thick solder mask.

SUMMARY

There may be a need to provide a thick solder mask structure for a component carrier which can be manufactured in a reliable way and which can be operated with high performance.

According to an exemplary embodiment of the invention, a component carrier system is presented. The component carrier system comprises a component carrier, a base solder mask formed on a surface of the component carrier and a top solder mask formed on top of a predefined section of the base solder mask. The predefined section of the base solder mask covers a target section of the component carrier.

In an exemplary embodiment the top solder mask may comprise an undercut at an interface section to the surface of the base solder mask.

According to a method for manufacturing the above-described component carrier system, a base solder mask is formed on the surface of the component carrier. Next, at specific target locations and for example after hardening the base solder mask, a top solder mask layer is formed onto the base solder mask.

Specifically, according to a further exemplary embodiment, the top solder mask forms an undercut at an interface section to the surface of the base solder mask.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

In the context of the present application, the term "component carrier material" may particularly denote a connected arrangement of one or more electrically insulating layer structures and/or one or more electrically conductive layer structures as used in component carrier technology. More specifically, such component carrier material may be material as used for printed circuit boards (PCBs) or IC substrates. In particular, electrically conductive material of such a component carrier material may comprise copper. Electrically insulating material of the component carrier material may comprise resin, in particular epoxy resin, optionally in combination with reinforcing particles such as glass fibers or glass spheres.

The base solder mask may cover large areas or cover complete surface of the component carrier in order to protect respective conductive traces, paths and/or electronic components. The base solder mask may be for example a dry film solder mask.

The top solder mask is applied onto a top surface of the base solder mask only above target sections of the component carrier. Hence, along sections surrounding the target sections of the component carrier, only the base solder mask is applied, wherein above target sections, the base solder mask and the top solder mask is applied in order to provide a larger thickness at the target sections. Hence, the larger thickness provides a better protection. Additionally, the larger thickness of the solder mask at the target section may be used for example for a component alignment of the component mounted on the surface of the component carrier or for ID (identification) marker purposes.

Additionally, by the present approach, an undercut is formed in the top solder mask at the interface section to the surface of the base solder mask. For example, the top solder mask may be formed by applying top mask layer material along the surface of the base solder mask, wherein the top solder mask is removed around the target sections, so that at the target sections the respective section of the top mast layer is arranged on the base solder mask. Hence, by applying a respective material (e.g., a photo-imageable ink or a dry film) of the top solder mask onto the base solder mask and by applying polymerizing light, the top solder surface will be slightly more polymerized on the top part compared to bottom part. For that reason, during developing, the bottom edge will be removed slightly for creating the undercut.

Specifically, the top solder mask may be applied to the base solder mask after the base solder mask is formed and solidifies on the component carrier. Alternatively, the top solder mask may be formed on the base solder mask before the base solder mask is formed onto the surface of the component carrier. After the top solder mask and the base solder mask are hardened, the arrangement of top solder mask and the base solder mask is applied onto the surface of the component carrier.

By providing the undercut, an improved recognition for positioning systems is given, because by using the undercut a specific reflection characteristic of sensor signals of the positioning system is generated. Specifically, a reliable determination of the position of the undercut is possible in contrast to a simple edge of the top solder mask. For example, for subsequence drilling steps (mechanical or a laser drilling) and improved position control of the holes to be drilled is achieved, since an improved measurement of the respective positions along the top solder mask edges is achieved.

According to further exemplary embodiment, the undercut is formed along at least one a bottom edge of the top solder mask. Hence, the base solder mask may form a flat and homogeneous surface, whereas the undercut is only provided by a respective recess along the bottom edge of the top solder mask.

The top solder mask may have a circular, elliptical or rectangular contact surface with the base solder mask. Along the bottom edge or all bottom edges of the top solder mask surrounding the contact surface of the top solder mask being in contact with the base solder mask, the respective undercut is formed.

According to further exemplary embodiment, the bottom edge has a chamfered shape for forming the undercut. According to further exemplary embodiment, the bottom edge has a rounded shape for forming the under-cut.

According to further exemplary embodiment, the top solder mask comprises a chamfered or rounded edge along a top surface of the top solder mask being spaced apart from the base solder mask. Hence, the coating patterns of the top solder mask do not comprise a respective perpendicular edge such that damages to corner edges can be avoided.

According to further exemplary embodiment, the base solder mask is thicker than the top solder mask. Alternatively, the top solder mask can be thicker than the base solder mask.

According to further exemplary embodiment, the top solder mask is formed in a predefined pattern onto the base solder mask. As described above, the top solder mask may first cover a wide area of the base solder mask, wherein a subsequent process step, parts of the top solder mask can be removed in order to form a respective pattern of the top solder mask, specifically along the target section of the component carrier.

According to further exemplary embodiment, the top solder mask has a thickness between 15 µm and 30 µm. Specifically, the top solder mask may have a thickness between 20 µm and 25 µm.

According to further exemplary embodiment, the base solder mask is a dry film solder mask. According to a further exemplary embodiment, the top solder mask is a solder mask ink. The solder mask ink may be a liquid photo-imageable solder mask (LPSM or LPI) ink and the base solder mask may be a dry film photo-imageable solder mask (DFSM). The top solder mask ink can be silkscreened or sprayed on the base solder mask. The dry film base solder mask may be for example vacuum-laminated on the component carrier and then exposed and developed.

In a further exemplary embodiment, a further top solder mask may be formed on the top solder mask. Hence, at a specific target location, a thicker overall thickness of the solder mask layers can be provided.

According to further exemplary embodiment, the target section of the component carrier is a pad section or a conductive path of the component carrier.

According to further exemplary embodiment, the component carrier system further comprises a component arranged onto the component carrier, wherein the target section surrounds at least partially the component. The target section may form an alignment frame for the alignment of the com-ponent. Depending on the component, it may be sufficient to apply the top solder mask only on specific sections of the component carrier, such as on regions, where edges of the component are located. For example, the alignment frame may form small stripes along a side of the component for aligning the placement of the component. The alignment frame formed by the top solder mask may also fully surround the component. Hence, the component may be aligned along the top solder mask such that a proper alignment procedure of the component onto a component carrier may be provided.

Summarizing, by the present approach a second layer of solder mask ink (i.e., the top solder mask) is coated on top of one layer of dry film solder mask (i.e., the base solder mask). Typically, the thicker solder resist may only be needed at specific location, e.g., target sections of the component carrier. Hence, the second top solder mask forms an ink pattern on top of the base (e.g., dry film) solder mask. Furthermore, the thicker solder resist/mask thickness is generated only at targeted sections. Furthermore, the second top solder mask pattern may have at least one rounded edge instead of perpendicular sharp edges. This may avoid damages at the corner edge since sharp corner edges may break off easier.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo-imageable or dry-etchable organic material like epoxy-based build-up material (such as epoxy-based build-up film) or polymer compounds (which may or may not include photo- and/or thermo-sensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylene ether (PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photo-imageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular metals coated with supra-conductive material or conductive polymers, such as graphene or poly (3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a dynamic random access memory (DRAM) or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, the electrically insulating solder resist may be applied to one or both opposing main surfaces of the layer stack or component carrier in terms of surface treatment. For instance, it is possible to form the base solder mask on an entire main surface and to subsequently pattern the layer of the base solder mask so as to expose one or more electrically conductive surface portions which shall be used for electrically coupling the component carrier to an electronic periphery. The surface portions of the component carrier remaining covered with base solder mask/resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
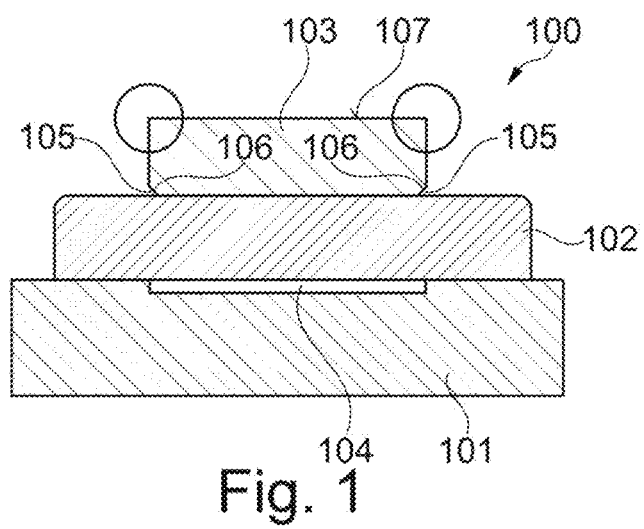
FIG. 1 illustrates a side view of a component carrier system according to an exemplary embodiment.

The illustrations in the drawings are schematically presented. In different drawings, similar or identical elements are provided with the same reference signs.

Figure 2:
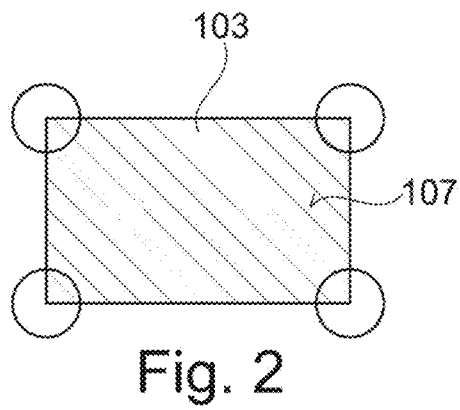
FIG. 2 illustrates a top view of the top solder mask shown in FIG. 1 according to an exemplary embodiment.

FIG. 1 illustrates a side view of a component carrier system 100 according to an exemplary embodiment. FIG. 2 illustrates a top view of the top solder mask 103 shown in FIG. 1 according to an exemplary embodiment.

The component carrier system 100 comprises a component carrier 101, a base solder mask 102 layer formed on a surface of the component carrier 101, and a top solder mask 103 layer formed on top of a predefined section of the base solder mask 102. The predefined section of the base solder mask 102 covers a target section 104 of the component carrier 101. The top solder mask 103 comprises an undercut 105 at an interface section to the surface of the base solder mask 102.

The base solder mask 102 covers large areas of the component carrier 101 in order to protect respective conductive traces, paths and/or electronic components. The top solder mask 103 is applied onto a top surface of the base solder mask 102 only above target sections 104 of the component carrier. Hence, along sections surrounding the target sections 104 of the component carrier 101, only the base solder mask 102 is applied, wherein above target sections 104, the base solder mask 102 and the top solder mask 103 is applied in order to provide a larger thickness at the target sections. Hence, the larger thickness provides a better protection.

Additionally, the undercut 105 is formed in the top solder mask 103 at the interface section to the surface of the base solder mask 104. For example, the top solder mask 103 may be formed by applying top mask layer material along the surface of the base solder mask 102. The undercut 105 is formed, e.g., by applying respective material of the top solder mask onto the base solder mask. For example, a photo-imageable ink or a dry film is applied onto the base solder mask 102 and in a subsequent step polymerizing light applied from the top. The top solder surface 103 will be slightly more polymerized on the top part compared to bottom part. For that reason, during developing, the bottom edge 106 will be removed slightly for creating the undercut 105. The undercut 105 is formed along at least one a bottom edge 106 of the top solder mask 103. Hence, the base solder mask 102 may form a flat and homogeneous surface, whereas the undercut 105 is only provided by a respective recess along the bottom edge 106 of the top solder mask 103.

The top solder mask 103 has in the exemplary embodiment a highly rectangular contact surface with the base solder mask 102 and a respective top surface 107. Along the bottom edge 106 the top solder mask 103 surrounding the contact surface of the top solder mask 103 being in contact with the base solder mask 102, the respective undercut 105 is formed.

As shown in the exemplary embodiment in FIG. 1, the bottom edge 106 has a chamfered shape for forming the undercut 105.

Figure 3:
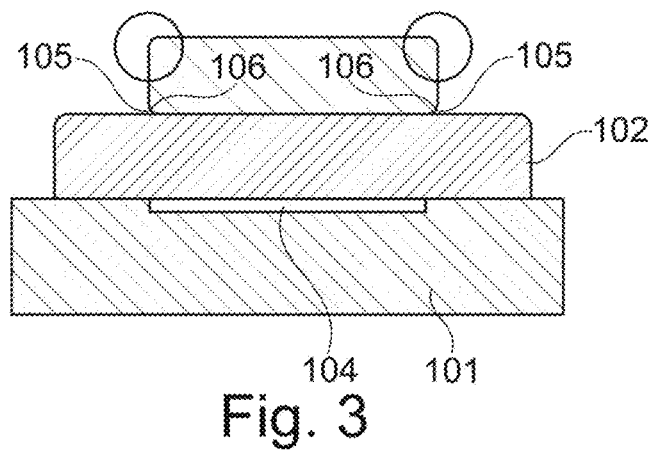
FIG. 3 illustrates a side view of a further component carrier system according to an exemplary embodiment.
Figure 4:
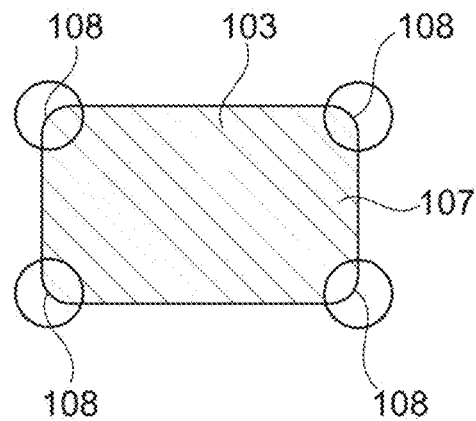
FIG. 4 illustrates a top view of the top solder mask shown in FIG. 3 according to an exemplary embodiment.

FIG. 3 illustrates a side view of a component carrier system 100 according to an exemplary embodiment. FIG. 4 illustrates a top view of the top solder mask 103 shown in FIG. 1 according to an exemplary embodiment.

The component carrier system 100 shown in the FIGS. 3 and 4 are similar to the component carrier system 100 shown in the FIGS. 1 and 2, whereas the bottom edge 107 has a rounded shape for forming the undercut 105.

The top solder mask 103 comprises a chamfered or rounded edge 108 along a top surface 107 of the top solder mask 103 being spaced apart from the base solder mask 102. Hence, the coating patterns of the top solder mask 103 do not comprise a respective perpendicular edge as shown in FIG. 2.

Figure 5:
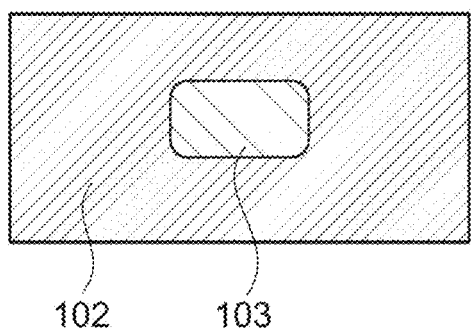
FIG. 5 illustrates a top view of the top solder mask shown in FIG. 6 according to an exemplary embodiment.
Figure 6:
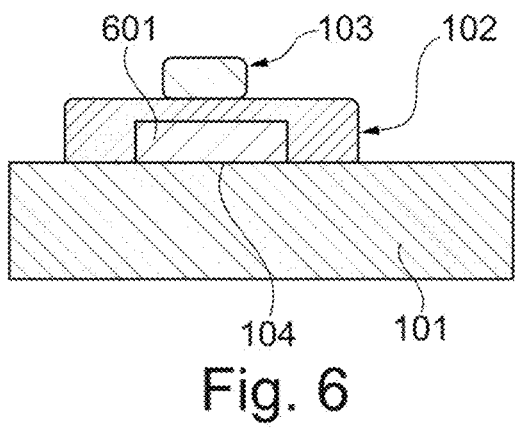
FIG. 6 illustrates a side view of a further component carrier system according to an exemplary embodiment.

FIG. 5 illustrates a top view of the top solder mask 103 shown in FIG. 6 which illustrates a side view of a further component carrier system 100 according to an exemplary embodiment. The component carrier system 100 shown in FIGS. 5 and 6 is similar to the component carrier system 100 shown in FIGS. 3 and 4, whereas the target section 104 of the component carrier 101 is, e.g., a pad section 601.

Figure 7:
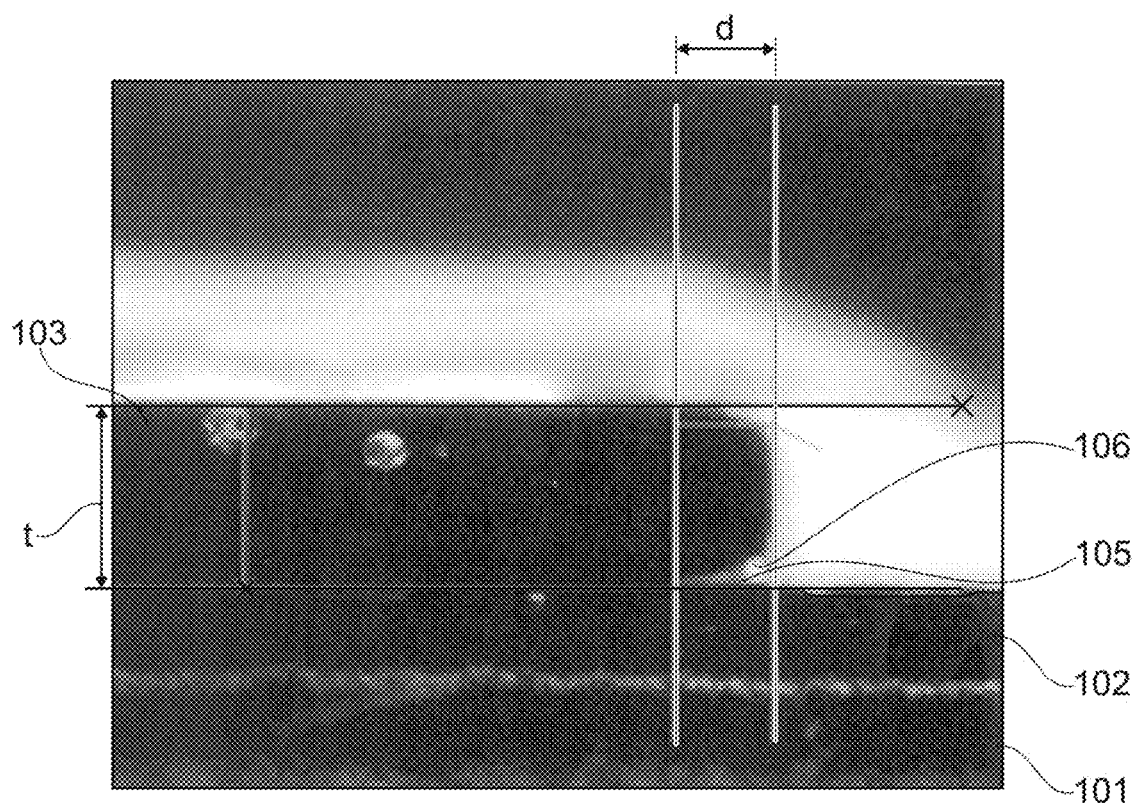
FIG. 7 illustrates an enlarged view of a component carrier system according to an exemplary embodiment.

FIG. 7 illustrates an enlarged view of a component carrier system 100 according to an exemplary embodiment. The top solder mask 103 has a thickness of 20 µm to 25 µm, specifically approximately 23 µm. Furthermore, the depth d of the undercut 105 formed by the bottom edge 106 is shown. The depth d is measured as the shortest distance along the surface of the base solder mask 102 between a lateral surface of the top solder mask 103 and a contact point between the base solder mask 102 and the top solder mask 103. The depth may be for example 5 µm to 15 µm (micrometers), specifically approximately 11 µm. In the exemplary embodiment shown in FIG. 7, the top solder mask 103 is thicker than the base solder mask 102.

Figure 8:
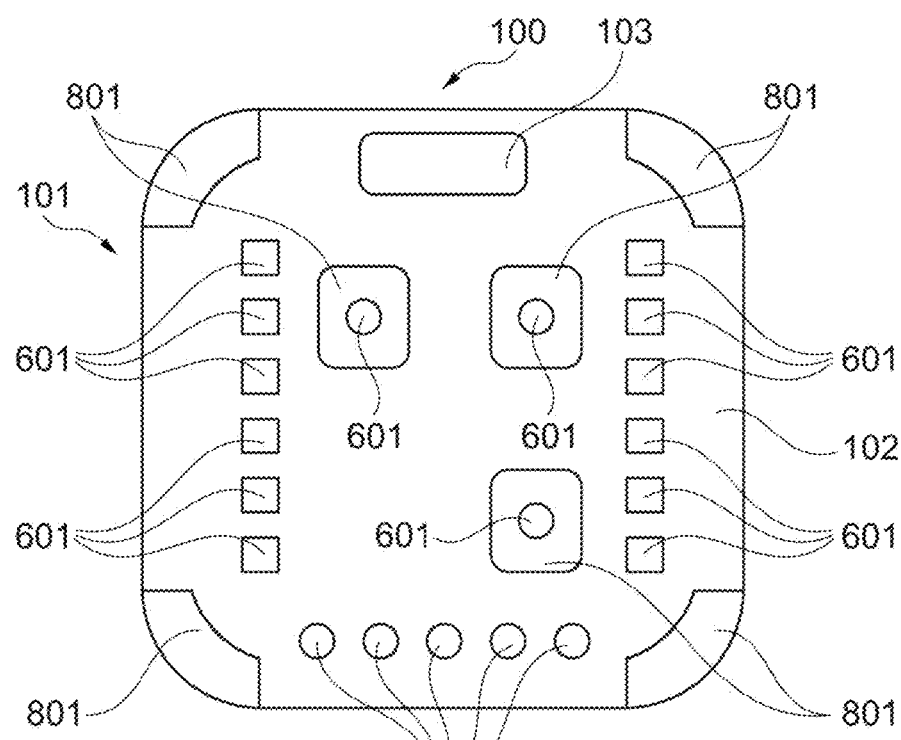
FIG. 8 illustrates a component carrier system having an arrangement of pad sections and a respective top solder mask according to an exemplary embodiment.

FIG. 8 illustrates a component carrier system 100 having an arrangement of pad sections 601 and a respective top solder mask 103 according to an exemplary embodiment. The component carrier 101 comprises a top laminate layer 801 which is almost fully covered by the base solder mask 102. Corner regions of the laminate layer 801 remain for example uncovered. Furthermore, along the sides of the component carrier 101, a plurality of uncovered pad sections 601 is formed. In the central region of the component carrier 101 further pad sections 601 are shown, wherein a circumferential region is free of the base solder mask 102.

Specifically, along an upper side section of the component carrier 101, a section of the base solder mask 102 covered by the top solder mask 103 is shown. The top solder mask 103 may cover further pad sections 106 or may be used for example as an identification marker to identify the specific component carrier 101.

Figure 9:
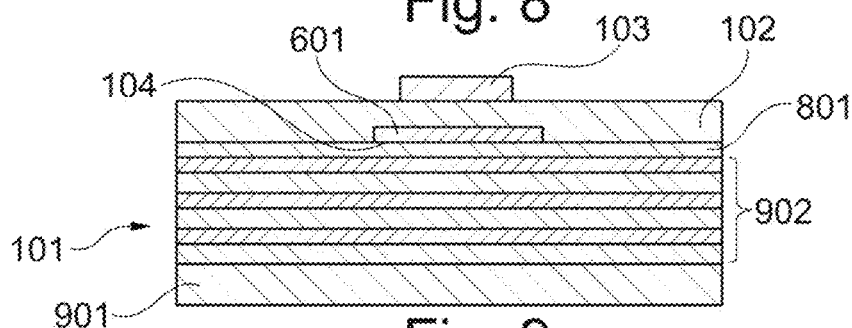
FIG. 9 illustrates a side view of a further component carrier system comprising a stacked component carrier having a bottom solder mask according to an exemplary embodiment.

FIG. 9 illustrates a side view of a further component carrier system comprising a stacked component carrier having a bottom solder mask according to an exemplary embodiment. The top solder mask 103 is arranged above a target section 104 onto which a pad section 601 is placed onto a laminate layer 801. Hence, above the target section 104 the base solder mask 102 and the top solder mask 103 is arranged. Specifically, it is shown, that the component carrier 101 may form a stack 902 made of a plurality of stacked conductive and nonconductive, electrically insulating layer structures. Furthermore, the bottom surface of the component carrier 101 is covered by a further base solder mask 901.

Figure 10:
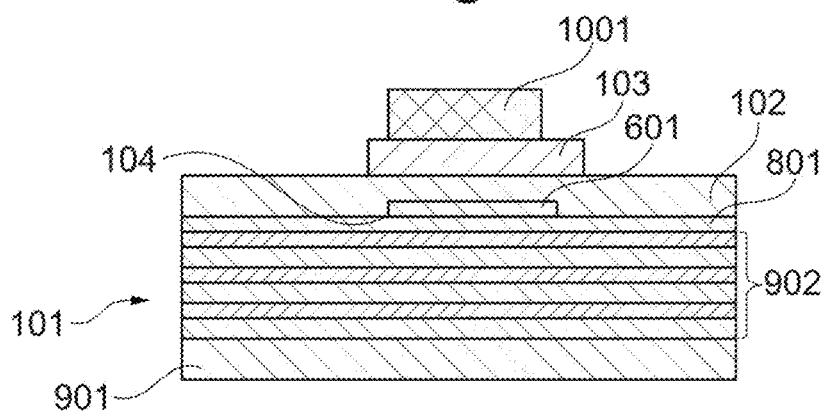
FIG. 10 illustrates a side view of a further component carrier system comprising a stacked component carrier having a further top solder mask according to an exemplary embodiment.

FIG. 10 illustrates a side view of a further component carrier system 100 which is similar to the component carrier system 100 shown in FIG. 9. Additionally, further top solder mask 1001 is arranged onto the top solder mask 103. Hence, the height of the solder masks 102, 103, 1001 may be increased above the target section 104.

FIG. 11 to FIG. 15 illustrate top views of component carrier systems 100 showing different shapes of top solder masks 103 providing an identification function (ID identification) according to an exemplary embodiment. The component carrier systems 100 are similar to the component carrier system 100 shown in FIG. 10, wherein the shapes of the top solder masks 103 vary.

Figure 11:
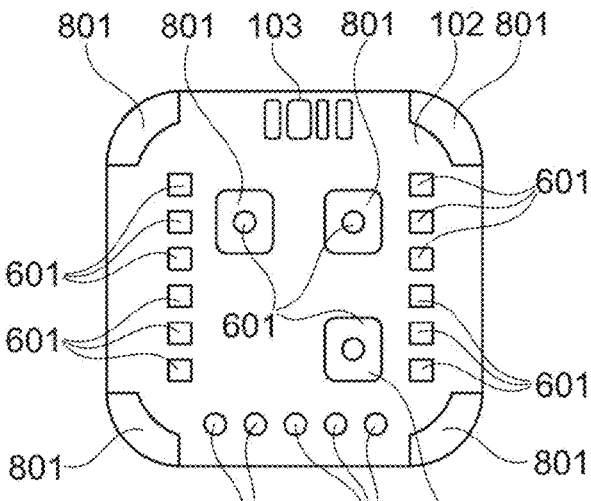
FIG. 11, FIG. 12, FIG. 13, FIG. 14 and FIG. 15 illustrate top views of component carrier systems showing different shapes of top solder masks providing an identification function according to an exemplary embodiment.

As can be taken from FIG. 11, the top solder mask 103 may form an individual pattern of small stripes, similar to a barcode, in order to form a measurable individual identification for the component carrier system 100.

Figure 12:
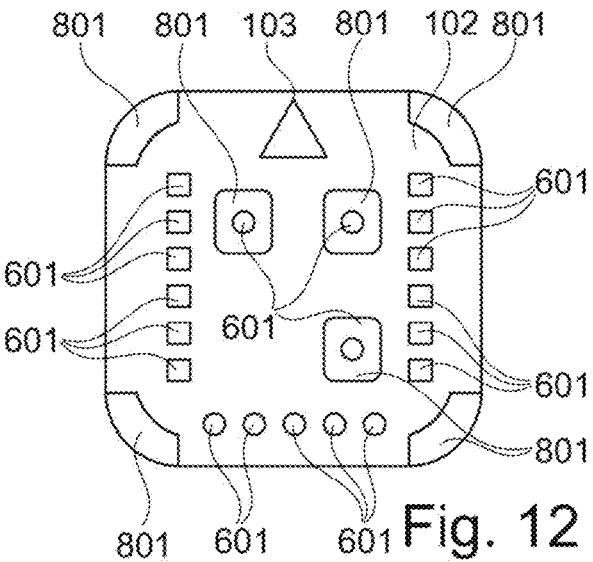

FIG. 12 shows a top solder mask 103 having the shape of a triangle. By using the shape of a triangle, beside the identification of the component carrier system 100, also the orientation of the component carrier system 100 can be measured.

Figure 13:
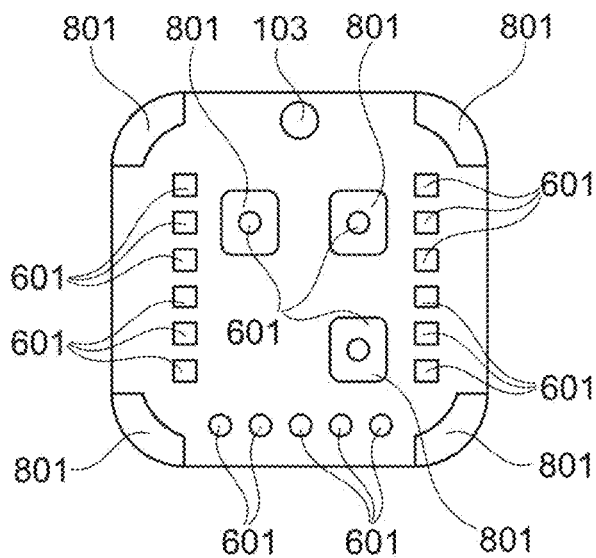

FIG. 13 shows a top solder mask 103 having the shape of a circle.

Figure 14:
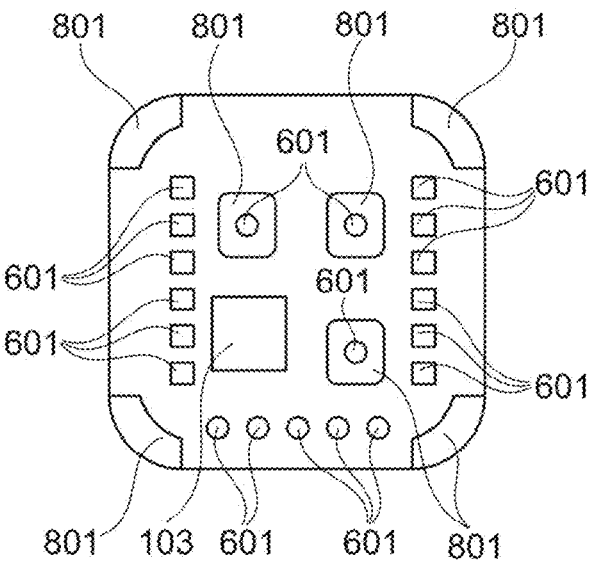

FIG. 14 shows a top solder mask 103 having the shape of a rectangle. As can be taken from the exemplary embodiment of the component carrier system 100 shown in FIG. 14, the top solder mask 103 used for identification purposes may also be arranged in a central region of the component carrier 101.

Figure 15:
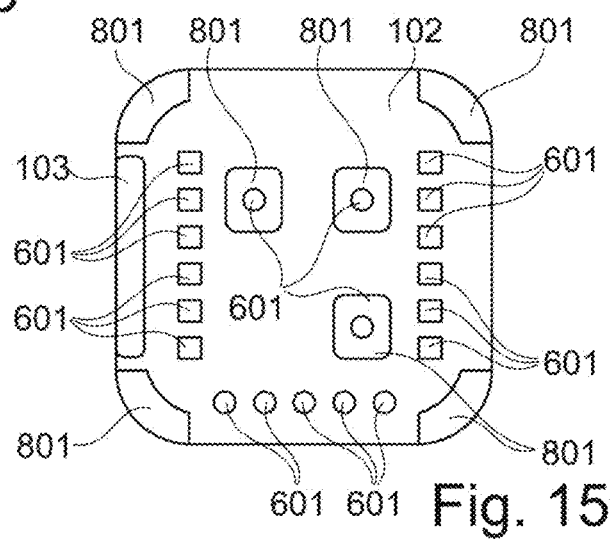

FIG. 15 shows a top solder mask 103 having the shape of a strip being placed along a lateral edge of the component carrier 101.

FIG. 16 to FIG. 23 illustrate top views of component carrier systems showing different shapes of top solder masks 103 providing an alignment frame for a component to be placed onto the component carrier 101 according to an exemplary embodiment.

Figure 16:
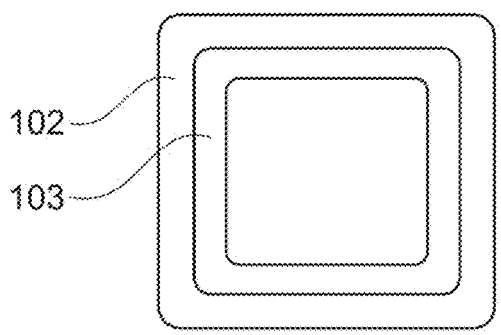
FIG. 16, FIG. 17, FIG. 18, FIG. 19, FIG. 20, FIG. 21, FIG. 22 and FIG. 23 illustrate top views of component carrier systems showing different shapes of top solder masks providing an alignment frame for a component to be placed onto the component carrier according to an exemplary embodiment.

FIG. 16 shows a top solder mask 103 forming a surrounding frame in the shape of a square. Hence, the component may be placed and aligned inside the surrounding frame.

Figure 17:
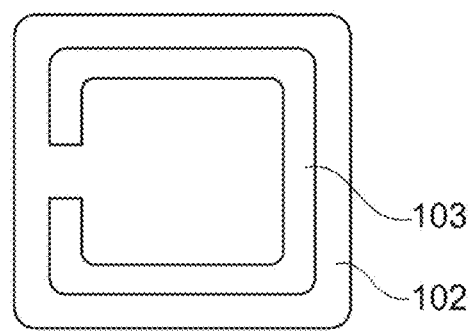

FIG. 17 shows a top solder mask 103 forming a frame the in the shape of a square. The frame may not fully surround the inner region and may provide an opening at a lateral side. Hence, the component may be placed and aligned inside the surrounding frame.

Figure 18:
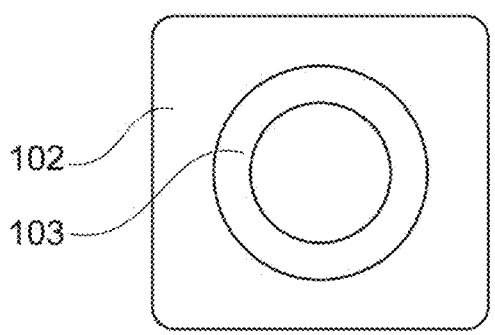

FIG. 18 shows a top solder mask 103 forming a surrounding frame in the shape of a ring. Hence, the component may be placed and aligned inside the surrounding frame.

Figure 19:
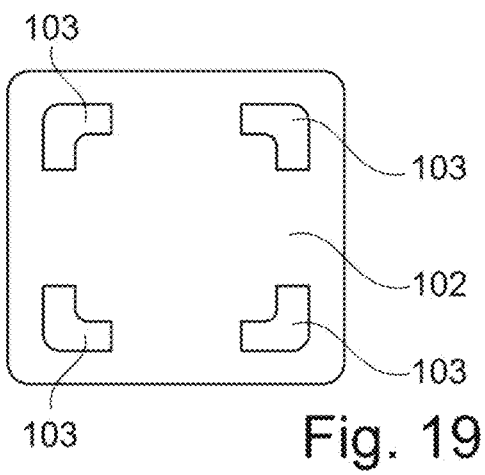

FIG. 19 shows a top solder mask 103 forming a frame, wherein the top solder mask is only formed at corner regions of the frame.

Figure 20:
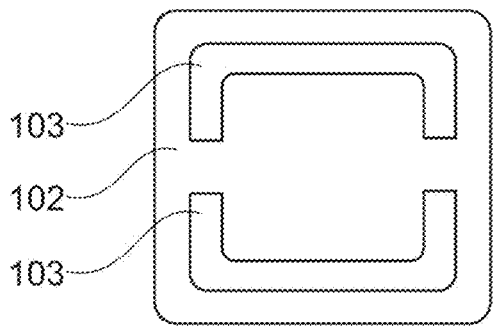

FIG. 20 shows a top solder mask 103 forming a frame in the shape of two U-shaped alignment bars. Hence, the component may be placed and aligned inside the surrounding alignment bars.

Figure 21:
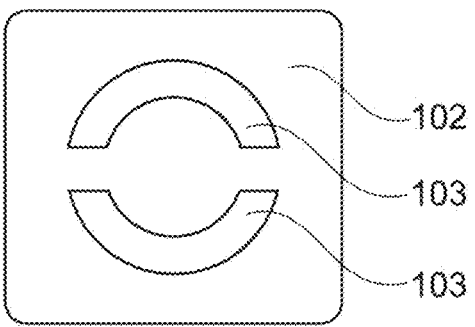

FIG. 21 shows a top solder mask 103 forming a frame arranged along lateral U-shaped alignment ring sections. Hence, the component may be placed and aligned inside the surrounding alignment ring sections.

Figure 22:
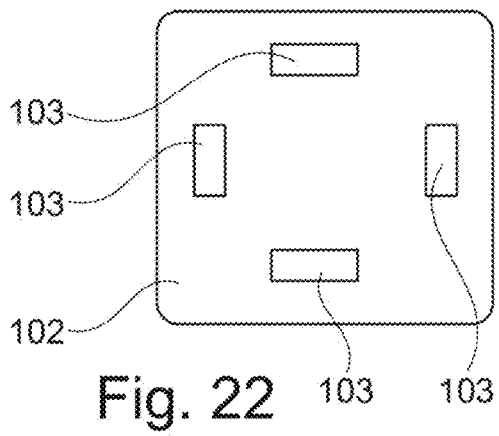

FIG. 22 shows a top solder mask 103 forming a frame in the shape of several straight alignment bars surrounding an inner arrangement section for the component.

Figure 23:
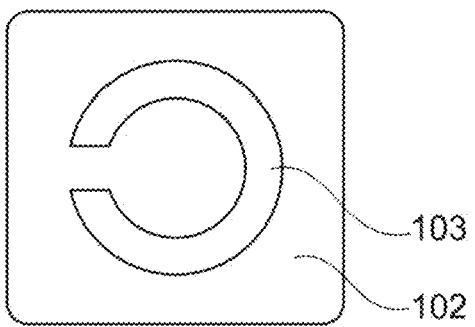

FIG. 23 shows a top solder mask 103 forming a surrounding frame in the shape of an open ring. Hence, the component may be placed and aligned inside the surrounding frame.

It should be noted that the term "comprising" does not exclude other elements or steps and the use of the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

LIST OF REFERENCE SIGNS 100 component carrier system
101 component carrier
102 base solder mask
103 top solder mask
104 target section
105 undercut
106 bottom edge
107 top surface
108 edge
601 pad section
801 laminate
901 bottom solder mask
902 stack
1001 further top solder mask
t thickness top solder mask
d depth undercut

The invention claimed is:

1. A component carrier system, comprising:
a component carrier,
a base solder mask layer formed on a surface of the component carrier,
a top solder mask layer formed on top of a predefined section of the base solder mask,
wherein the predefined section of the base solder mask covers a target section of the component carrier,
wherein the top solder mask comprises an undercut at an interface section to the surface of the base solder mask.

2. The component carrier system according to claim 1, wherein the undercut is formed along at least one a bottom edge of the top solder mask.

3. The component carrier system according to claim 2, wherein the bottom edge has a chamfered shape for forming the undercut.

4. The component carrier system according to claim 2, wherein the bottom edge has a rounded shape for forming the undercut.

5. The component carrier system according to claim 1, wherein the top solder mask comprises a chamfered or rounded edge along a top surface of the solder mask being spaced apart from the base solder mask.

6. The component carrier system according to claim 1, wherein the base solder mask is thicker than the top solder mask.

7. The component carrier system according to claim 1, wherein the top solder mask is formed in a predefined pattern onto the base solder mask.

8. The component carrier system according to claim 1, wherein the top solder mask has a thickness between 15 μm and 30 μm.

9. The component carrier system according to claim 1, wherein the base solder mask is a dry film solder mask.

10. The component carrier system according to claim 1, wherein the top solder mask is a solder mask ink.

11. The component carrier system according to claim 1, further comprising:
a second top solder mask formed on the top solder mask.

12. The component carrier system according to claim 1, wherein the target section of the component carrier is a pad section or a conductive path of the component carrier.

13. The component carrier system according to claim 1, further comprising:
a component arranged onto the component carrier,
wherein the target section surrounds at least partially the component.

* * * * *